United States Patent
Wu et al.

(10) Patent No.: US 10,153,459 B2
(45) Date of Patent: Dec. 11, 2018

(54) OPTOELECTRONIC PACKAGE

(71) Applicant: UNISTARS CORPORATION, Zhudong Township (TW)

(72) Inventors: Shang-Yi Wu, Hsinchu (TW); Hsin-Hsien Hsieh, Zhongli (TW)

(73) Assignee: UNISTARS CORPORATION, Hsinchu (TW)

( * ) Notice: Subject to any disclaimer, the term of this patent is extended or adjusted under 35 U.S.C. 154(b) by 0 days.

(21) Appl. No.: 15/650,989

(22) Filed: Jul. 17, 2017

(65) Prior Publication Data

US 2018/0301663 A1 Oct. 18, 2018

(30) Foreign Application Priority Data

Apr. 12, 2017 (TW) .............................. 106112190 A

(51) Int. Cl.
*H01L 51/52* (2006.01)
*H01L 51/10* (2006.01)

(52) U.S. Cl.
CPC ........ *H01L 51/5268* (2013.01); *H01L 51/107* (2013.01); *H01L 51/524* (2013.01); *H01L 51/5275* (2013.01)

(58) Field of Classification Search
CPC .. H01L 51/5268–51/5275; H01L 33/10; H01L 33/40–33/46; H01L 33/50; H01L 33/60; H01L 22/12; H01L 31/0543
See application file for complete search history.

(56) References Cited

U.S. PATENT DOCUMENTS

| 9,443,904 | B1 * | 9/2016 | Chen | H01L 25/075 |
| 2012/0019123 | A1 * | 1/2012 | Furukawa | H01L 33/54 313/483 |
| 2014/0077682 | A1 * | 3/2014 | Ho | H05B 33/02 313/117 |
| 2014/0197438 | A1 * | 7/2014 | Oh | H01L 33/486 257/98 |

* cited by examiner

*Primary Examiner* — Cuong B Nguyen
(74) *Attorney, Agent, or Firm* — Ding Yu Tan

(57) ABSTRACT

An optoelectronic package includes a substrate, a light emitting chip, an optical sealant, and an optical scattering layer. The substrate has a carrying plane and a wiring layer formed on the carrying plane. The light emitting chip used for emitting a light ray is mounted on the carrying plane and electrically connected to the wiring layer. The optical sealant covers the carrying plane and wraps the light emitting chip. The optical sealant is located in the path of the light ray. The optical scattering layer covers the optical sealant. The optical sealant located in the path of the light ray is formed between the substrate and the optical scattering layer. Preferably, the refractive index of the optical sealant is larger than or equal to the refractive index of the optical scattering layer.

14 Claims, 3 Drawing Sheets

OPTOELECTRONIC PACKAGE

FIELD OF THE INVENTION

The present invention relates to an optoelectronic package, and more particularly to an optoelectronic package having an optical scattering layer.

BACKGROUND OF THE INVENTION

A Light Emitting Diode (LED) is a semiconductor package and has a diode die that is capable of emitting light rays. Generally, each of the most LEDs has a small viewing angle, so that the LED emits light rays in a concentrated manner, thereby causing that the LED to be difficult of emitting the light rays uniformly. Accordingly, the LED is suitable for making a lamp having a narrow range of illumination (or narrow beam angle), such as a flashlight. However, making a lamp used for a wide range of illumination (or wider beam angle), such as a ceiling light (i.e. ceiling fitting), requires of adding additional optical components for producing better or improved illuminating effect.

SUMMARY OF THE INVENTION

The present invention provides an optoelectronic package that has an optical scattering layer for diffusing light rays.

According to an embodiment of the present invention, the optoelectronic package includes a substrate, a light emitting chip, an optical sealant, and an optical scattering layer. The substrate has a carrying plane and a wiring layer formed on the carrying plane. The light emitting chip is mounted on the carrying plane and electrically connected to the wiring layer, in which the light emitting chip is used for emitting a light ray. The optical sealant covers the carrying plane and wraps the light emitting chip, in which the optical sealant is located in the path of the light ray. The optical scattering layer covers the optical sealant, in which the optical sealant is formed between the substrate and the optical scattering layer, and located in the path of the light ray. Preferably, the refractive index of the optical sealant is larger than or equal to the refractive index of the optical scattering layer.

In an embodiment of the invention, the light emitting chip has a light emitting surface, and the optical sealant covers and touches the light emitting surface.

In an embodiment of the invention, the light emitting chip further has a back surface opposite to the light emitting surface. The back surface faces to the carrying plane.

In an embodiment of the invention, the light emitting chip is a LED chip.

In an embodiment of the invention, the sidewall of the optical sealant is flush with the sidewall of the optical scattering layer.

In an embodiment of the invention, the optical sealant contains a fluorescent material, and the fluorescent material is stimulated by the light ray to emit fluorescent light rays.

In an embodiment of the invention, an optical transmittance of the optical scattering layer ranges between 50% and 90%.

In an embodiment of the invention, the light emitting chip is mounted on the carrying plane by wire bonding.

In an embodiment of the invention, the light emitting chip is mounted on the carrying plane by flip type.

In an embodiment of the invention, the substrate is a Printed Circuit Board (PCB) or a package carrier.

In an embodiment of the invention, the number of the light emitting chip is multiple, and the light emitting chips are mounted on the substrate by Chip On Board (COB).

The optoelectronic package according to the invention employs the optical scattering layer and the optical sealant to diffuse the light rays, so as to increase the viewing angle of the optoelectronic package, thereby emitting the light rays uniformly. Compared with the conventional LED, the optoelectronic package according to the invention is more applicable to the production of making the lamp having a wide range of illumination, such as a ceiling light.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of the preferred embodiments of this invention are presented herein for the purpose of illustration and description only. It is not intended to be exhaustive or to be limited to the precise form disclosed.

Figure 1:
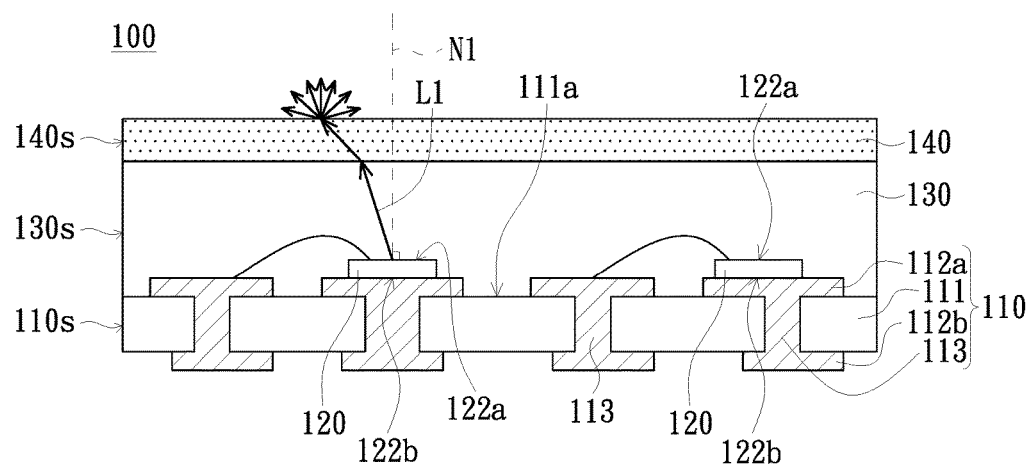
FIG. 1 is a schematic cross-sectional view of an optoelectronic package according to an embodiment of the present invention.

FIG. 1 is a schematic cross-sectional view of an optoelectronic package according to an embodiment of the present invention. Referring to FIG. 1, an optoelectronic package 100 includes a substrate 110 and at least one light emitting chip 120, in which the light emitting chip 120 is mounted on the substrate 110. The substrate 110 has a carrying plane 111a, whereas the light emitting chip 120 has a light emitting surface 122a and a back surface 122b opposite to the light emitting surface 122a thereof. The back surface 122b of the light emitting chip 120 faces to the carrying plane 111a and a wiring layer 112a of the substrate 110.

In the illustrated embodiment of FIG. 1, the optoelectronic package 100 includes two light emitting chips 120, and the light emitting chips 120 are mounted on the carrying plane 111a of the substrate 110 by wire bonding. However, in other embodiment, the number of the light emitting chip(s) 120 included by the optoelectronic package 100 may be only one or more than two. The light emitting chip 120 can be mounted on the carrying plane 111a by flip-chip type. Hence, the number of the light emitting chips 120 that is included by the optoelectronic package 100 is not limited to two, and techniques for mounting the light emitting chip 120 to the carrying plane 111a is not only limited to wire bonding.

The light emitting chip 120 can emit a light ray L1 from the light emitting surface 122a thereof. The light emitting chip 120 may be an unpackaged LED die or a packaged LED chip. The substrate 110 may be a PCB or a package carrier. In the illustrated embodiment of FIG. 1, the substrate 110 includes an insulating substrate 111, two wiring layers 112a and 112b, and a plurality of conductive plugs 113. The wiring layers 112a and 112b are separately disposed on two opposite sides of the insulating substrate 111. The insulating substrate 111 has the carrying plane 111a, and the wiring layer 112a is formed on the carrying plane 111a. The conductive plugs 113 disposed in the insulating layer 111 are connected to the wiring layers 112a and 112b, respectively, so that the wiring layers 112a and 112b are electrically connected to each other. In addition, when the light emitting chip 120 is the LED die, the light emitting chips 120 can be mounted on the substrate 110 by chip on board (COB), and the optoelectronic package 100 can be made as a discrete component.

It is worthy to note that in the embodiment of FIG. 1, the substrate 110, which includes two wiring layers 112a and 112b, is substantially a double-sided wiring board, but in other embodiment, the number of the wiring layer(s) included by the substrate 110 may be only one or more than two. That is, the substrate 110 may substantially be a single-sided wiring board or a multilayer wiring board, and not limited to a double-sided wiring board.

The optoelectronic package 100 further includes an optical sealant 130 and an optical scattering layer 140. The optical sealant 130 covers the carrying plane 111a of the insulating substrate 111 and the light emitting chip 120, whereas the optical scattering layer 140 covers the optical sealant 130. The optical sealant 130 is formed between the substrate 110 and the optical scattering layer 140. The optical sealant 130 not only wraps or encapsulates the light emitting chip 120, but also covers and touches the light emitting surface 122a of the light emitting chip 120, so that the optical sealant 130 is located in the path of the light ray L1. In one of the embodiments of the invention, the optical sealant 130 can include a fluorescent material that is stimulated by the light ray L1 to emit fluorescent light rays. In other words, the wavelength and the color of the light ray L1 can be changed after the light ray L1 passes through the optical sealant 130 including the fluorescent material.

For example, the light emitting chip 120 may be a LED die which can emit a blue light ray L1, and the optical sealant 130 includes the fluorescent material which is a yellow fluorescent material. After the light ray L1 passes through the optical sealant 130, the part of the blue light ray L1 stimulate the fluorescent material and generate some yellow light rays L2. Therefore, the initial blue light ray L1 from the LED chip and the yellow light ray L2 generated by fluorescent material are combined to form white light. In addition, it is necessary to note that in other embodiment, the optical sealant 130 may not include any fluorescent material so that the optical sealant 130 is not limited to including the fluorescent material.

The optical scattering layer 140 is also located in the path of the light ray L1. The refractive index of the optical sealant 130 is preferably larger than or equal to the refractive index of the optical scattering layer 140. Thus, the light ray L1 causes the refraction at the boundary between the optical sealant 130 and the optical scattering layer 140. The scattering angle formed between the light ray L1 emitted from the optoelectronic package 100 and the normal N1 (the normal shown as a dashed line in FIG. 1) of the light emitting surface 122a increases, so that the optoelectronic package 100 has a larger viewing angle. Moreover, because the refractive index of the optical sealant 130 is larger than the refractive index of the optical scattering layer 140, a part of the light ray L1 also causes a total reflection at the boundary between the optical sealant 130 and the optical scattering layer 140. Thus, the aforementioned part of the light ray L1 is reflected to the substrate 110, and then reflected by the wiring layer 112a. Therefore, the optical sealant 130 and the optical scattering layer 140 can cause the emitted light ray L1 to not be concentrated in the direction of the normal N1, thereby decreasing the frontal light intensity of the optoelectronic package 100 in the direction of the normal N1.

The optical scattering layer 140 can diffuse the light ray L1. For example, the optical scattering layer 140 may include scattering agents and silicone (not shown), in which the scattering agents have a plurality of scattering particles for scattering the light ray L1. The weight percent of the scattering agents and the silicone may range between 1:5 and 5:1. In addition, the optical transmittance of the optical scattering layer 140 may range between 50% and 90%, so that the frontal light intensity of the optoelectronic package 100 in the direction of the normal N1 can decrease by at least 30%. Therefore, the viewing angle of the optoelectronic package 100 can increase, so that the light ray L1 can be emitted uniformly from the optical scattering layer 140. Thus, the optoelectronic package 100 is advantageous for use in the production of wide (illumination) range illumination lamps.

Moreover, the optical sealant 130 may have the scattering agents as well. That is, both the optical sealant 130 and the optical scattering layer 140 have a plurality of scattering particles for scattering the light ray L1. However, the weight percent of the scattering particles in the optical sealant 130 is different from the weight percent of the scattering particles in the optical scattering layer 140. For example, the weight percent of the scattering particles in the optical sealant 130 is less than the weight percent of the scattering particles in the optical scattering layer 140, so as to improve the uniformity of emitting the light rays.

It is necessary to note that the light ray L1 shown in FIG. 1 seems to be scattered only at the upper or top surface of the optical scattering layer 140. However, in fact, since there are many scattering particles in the optical scattering layer 140, the light ray L1 is not only scattered at the upper or top surface of the optical scattering layer 140, but also scattered by the scattering particles inside the optical scattering layer 140. The light ray L1 scattered at the upper surface of the optical scattering layer 140 as shown (by small arrowed lines scattered to emit in different directions) in FIG. 1 is meant to illustrate the fact that the light ray L1 after passing through the optical scattering layer 140 can emit in all directions due to scattering. However, it does not mean that the light ray L1 is only scattered at the upper surface of the optical scattering layer 140. In addition, in other embodiment, the refractive index of the optical sealant 130 can be equal to the refractive index of the optical scattering layer 140. The optoelectronic package 100 of the other embodiment can only use the optical scattering layer 140 for increasing the viewing angle to achieve the effect of emitting the light ray L1 uniformly. Moreover, the optical scattering layer 140 may be a single-layer structure or a multilayer structure. When the optical scattering layer 140 is the multilayer structure, the optical scattering layer 140 can be formed by stacking many layers, so as to achieve the effect of preferable diffusion of light.

Figure 2A:
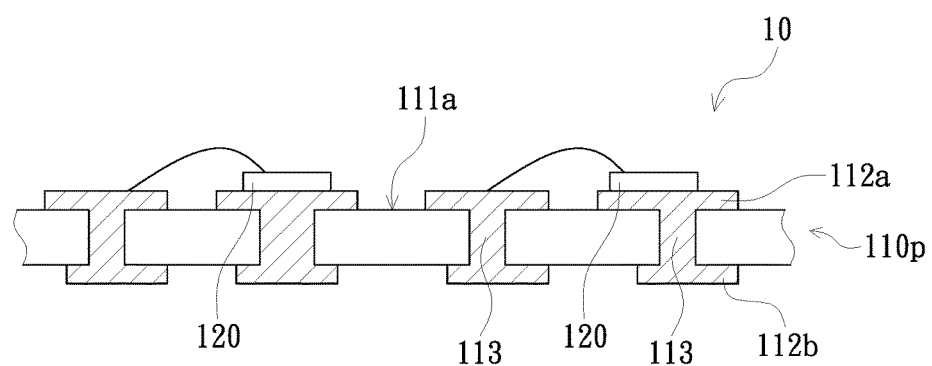
FIGS. 2A to 2D are schematic cross-sectional views showing steps of a manufacturing process of the optoelectronic package in FIG. 1.

FIGS. 2A to 2D are schematic cross-sectional views showing steps of a manufacturing process of the optoelectronic package in FIG. 1. Referring to FIG. 2A, in the manufacturing process of the optoelectronic package 100, first, a wiring board group 10 including a wiring panel 110p and a plurality of light emitting chips 120 is provided. The light emitting chips 120 are mounted on the wiring panel 110p. The wiring panel 110p substantially includes a plurality of substrates 110 (not marked or labelled in FIG. 2A, but is shown in FIG. 1 instead), and the substrates 110 are formed by dicing the wiring panel 110p. In other words, the wiring panel 110p is a panel or a strip, which is formed by the substrates 110 connected to each other, so that the wiring panel 110p also has a plurality of carrying planes 111a and includes a plurality of wiring layers 112a and 112b, and a plurality of conductive plugs 113.

Figure 2B:
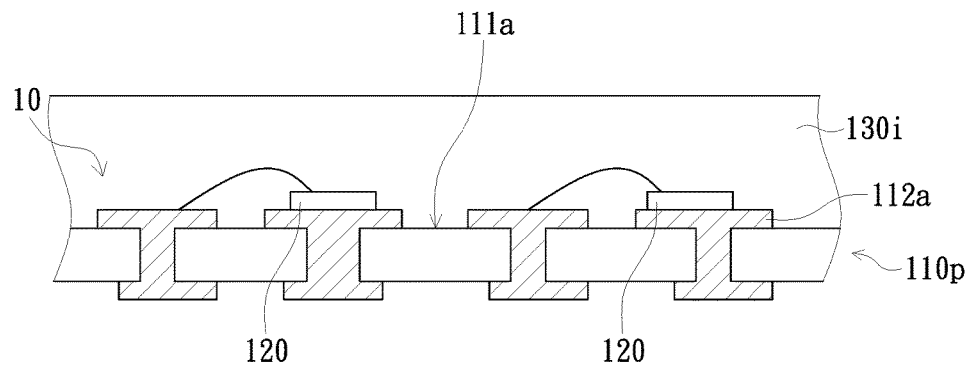
Figure 2C:
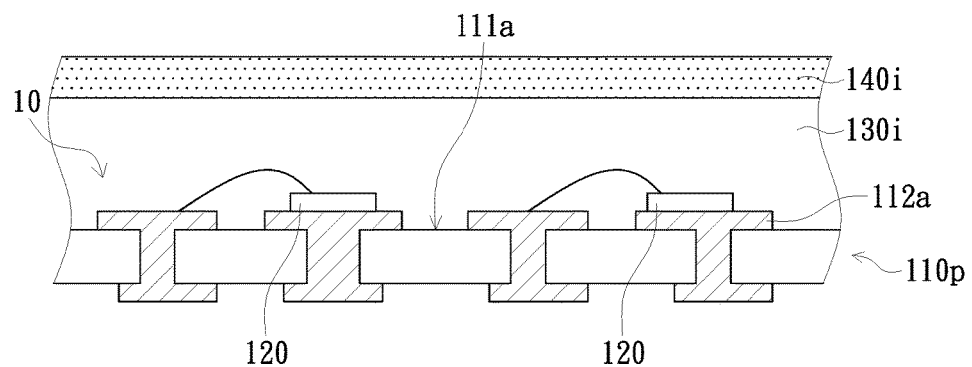

Referring to FIGS. 2B and 2C, then, an optical sealant 130i and an optical scattering layer 140i are formed on the wiring board group 10 in sequence. The optical sealant 130i covers the wiring board group 10 and wraps (or encapsulates) the light emitting chips 120. The optical scattering layer 140i completely covers a planar surface of the optical sealant 130i. Taking FIGS. 2B and 2C as example, the optical scattering layer 140i completely covers the upper planar surface of the optical sealant 130i. The optical sealant 130i and the optical scattering layer 140i are (made of) cured glues or adhesives. Formations of the optical sealant 130i and the optical scattering layer 140i include a plurality of means, such as coating, spraying or dispensing. Moreover, the optical scattering layer 140i may be a single layer structure in this embodiment (as shown in FIG. 1), but the optical scattering layer 140i may be a multilayer structure in other embodiment. That is, the optical scattering layer 140i may have a plurality of diffusion layers in stacks.

Figure 2D:
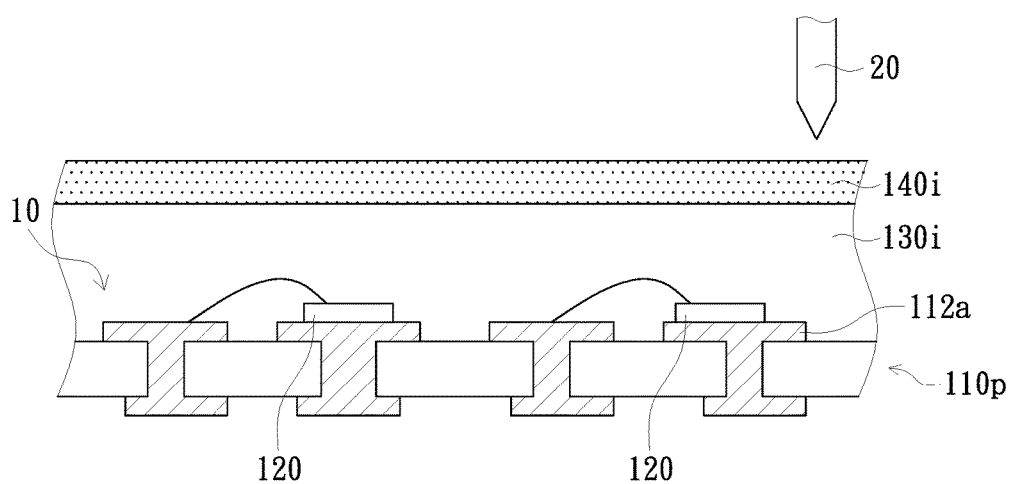

Referring to FIG. 2D and FIG. 1, afterwards, the wiring board group 10 is diced to form a plurality of optoelectronic packages 100. Specifically, the optical sealant 130i, the optical scattering layer 140i, and the wiring panel 110p can be diced by a blade 20, thereby forming the optoelectronic package 100 as shown in FIG. 1. Since the optical sealant 130 and the optical scattering layer 140 are formed by the blade 20 dicing the optical sealant 130i and the optical scattering layer 140i at a time, the sidewall 130s of the optical sealant 130, the sidewall 140s of the optical scattering layer 140, and the sidewall 110s of the substrates 110 are flush with each other in the same optoelectronic package 100, as shown in FIG. 1.

To sum up, the optoelectronic package according to the embodiments of the invention has a larger viewing angle by using the above-mentioned optical scattering layer and the optical scattering layer, thereby decreasing the frontal light intensity in the direction of the normal and increasing the lateral light intensity other than the direction of the normal. Accordingly, the optoelectronic package can cause the light ray to emit more uniformly without requiring of having expensive secondary optical elements, so that the above-mentioned optoelectronic package has an advantage of lower cost. Therefore, compared to the conventional LED, the optoelectronic package according to the embodiments of the invention is advantageous for use in the production of wide range illumination lamps, such as a ceiling light.

While the invention has been described in terms of what is presently considered to be the most practical and preferred embodiments, it is to be understood that the invention is not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optoelectronic package, comprising:
   a substrate having a carrying plane and a wiring layer, the wiring layer is formed on the carrying plane;
   a light emitting chip used for emitting a light ray mounted on the carrying plane and electrically connected to the wiring layer;
   an optical sealant covering the carrying plane and wrap the light emitting chip, wherein the optical sealant is located in a path of the light ray; and
   an optical scattering layer covering the optical sealant, wherein the optical sealant is formed between the substrate and the optical scattering layer, and the optical scattering layer is located in the path of the light ray, wherein a refractive index of the optical sealant is larger than or equal to a refractive index of the optical scattering layer;
   wherein both the optical sealant and the optical scattering layer have a plurality of scattering particles for scattering the light ray, and a weight percent of the scattering particles in the optical sealant is less than a weight percent of the scattering particles in the optical scattering layer.

2. The optoelectronic package of claim 1, wherein the light emitting chip has a light emitting surface, and the optical sealant covers and touches the light emitting surface of the light emitting chip.

3. The optoelectronic package of claim 2, wherein the light emitting chip further has a back surface opposite to the light emitting surface, and the back surface thereof faces to the carrying plane of the substrate.

4. The optoelectronic package of claim 1, wherein the light emitting chip is a LED chip.

5. The optoelectronic package of claim 1, wherein a sidewall of the optical sealant is flush with a sidewall of the optical scattering layer.

6. The optoelectronic package of claim 1, wherein the optical sealant contains fluorescent material, and the fluorescent material is stimulated by the light ray to emit fluorescent light rays.

7. The optoelectronic package of claim 1, wherein an optical transmittance of the optical scattering layer ranges between 50% and 90%.

8. The optoelectronic package of claim 1, wherein the light emitting chip is mounted on the carrying plane by wire bonding.

9. The optoelectronic package of claim 1, wherein the light emitting chip is mounted on the carrying plane by flip-chip type.

10. The optoelectronic package of claim 1, the substrate is a PCB or a package carrier.

11. The optoelectronic package of claim 1, wherein a number of the light emitting chips are plural and the number of light emitting chips are mounted on the substrate by Chip On Board (COB).

12. The optoelectronic package of claim 1, wherein the optical scattering layer is a single layer structure.

13. The optoelectronic package of claim 1, wherein the optical scattering layer is a multilayer structure.

14. The optoelectronic package of claim 1, wherein the optical scattering layer comprises a plurality of scattering agents and silicone, in which the scattering agents have the scattering particles, and a weight percent of the scattering agents and silicone ranges between 1:5 and 5:1.

* * * * *